United States Patent [19]
Hoffman et al.

[11] Patent Number: 5,764,484
[45] Date of Patent: Jun. 9, 1998

[54] GROUND RING FOR A METAL ELECTRONIC PACKAGE

[75] Inventors: Paul R. Hoffman, Modesto; Markus K. Liebhard, Oakland, both of Calif.

[73] Assignee: Olin Corporation, Manteca, Calif.

[21] Appl. No.: 749,259

[22] Filed: Nov. 15, 1996

Related U.S. Application Data

[60] Provisional application No. 60/007,374, Nov. 11, 1995.
[51] Int. Cl.⁶ .................. H01L 23/13; H01L 23/14
[52] U.S. Cl. .................. 361/761; 361/714; 361/764; 257/711; 438/121; 438/124; 174/52.4
[58] Field of Search .................. 361/761, 764, 361/714, 707, 717, 718, 722, 719; 257/709, 711, 713; 438/121, 122, 124, 456; 174/52.4, 52.5, 52.6

[56] References Cited

U.S. PATENT DOCUMENTS

| | | | |
|---|---|---|---|
| 3,649,872 | 3/1972 | Garboushian | 257/709 |
| 3,745,422 | 7/1973 | Carnes | 438/121 |
| 3,819,431 | 6/1974 | Kurtz | 438/53 |
| 4,688,077 | 8/1987 | Wakabayashi et al. | 257/713 |
| 4,939,316 | 7/1990 | Mahulikar et al. | 174/52.4 |
| 5,023,398 | 6/1991 | Mahulikar et al. | 174/52.4 |
| 5,045,921 | 9/1991 | Lin et al. | 257/680 |
| 5,055,967 | 10/1991 | Sukonnik et al. | 361/706 |
| 5,136,469 | 8/1992 | Carusillo et al. | 361/720 |
| 5,159,750 | 11/1992 | Dutta et al. | 174/52.2 |
| 5,198,693 | 3/1993 | Imken et al. | 257/720 |
| 5,239,131 | 8/1993 | Hoffman et al. | 174/52.4 |
| 5,316,536 | 5/1994 | Aiura et al. | 492/58 |
| 5,353,195 | 10/1994 | Fillion et al. | 361/760 |
| 5,420,460 | 5/1995 | Massingill | 257/693 |
| 5,452,510 | 9/1995 | Barnes et al. | 29/825 |
| 5,455,386 | 10/1995 | Brathwaite et al. | 174/52.4 |
| 5,629,835 | 5/1997 | Mahulikar et al. | 361/719 |

*Primary Examiner*—Leo P. Picard
*Assistant Examiner*—John B. Vigushin
*Attorney, Agent, or Firm*—Gregory S. Rosenblatt; Wiggin & Dana

[57] ABSTRACT

There is provided a component for an electronic package and a method for the manufacture of that component. The component has a metallic substrate with a surface coated by a dielectric. A centrally disposed cavity extends through the dielectric into the metallic substrate to a depth, $D_1$. Circumscribing and abutting this cavity is an annular channel having a depth $D_2$ that is less than $D_1$. A semiconductor device bonded to the base of the cavity is electrically interconnected to both circuit traces formed on the dielectric coating and to the annular channel.

A method of forming the annular channel is to mechanically mill a precursor annular channel having an outer wall a desired distance from the sidewalls of the metallic substrate and a width substantially greater than the desired width of the annular channel. A cavity is then formed in the region circumscribed by the outer wall of the precursor annular channel. The perimeter of this cavity approaches the outer wall of the precursor annular channel, terminating a desired distance from the outer wall such that that portion of the annular channel having a depth $D_2$ is a desired width, typically less than 0.015 inch.

13 Claims, 3 Drawing Sheets

GROUND RING FOR A METAL ELECTRONIC PACKAGE

CROSS-REFERENCE TO RELATED PATENT APPLICATION

This patent application is related to and claims priority from U. S. provisional patent application No. 60/007,374 that was filed on Nov. 20, 1995.

BACKGROUND OF THE INVENTION

1. Field of the Invention

This invention relates to an electronic package having a ground ring and a method for the manufacture of that ground ring. More particularly, an annular channel is mechanically milled into a metallic substrate such that the annular channel both circumscribes and abuts a cavity.

2. Description of the Related Art Metallic substrates are widely used as components for packages that encase one or more integrated circuit devices, such as silicon based semiconductor chips. Typically, the metallic substrate is coated with a dielectric layer and a pattern of circuit traces are formed on the dielectric layer. The inner ends of these circuit traces define a die attach region that contain one or more semiconductor devices. The devices are electrically interconnected to the circuit traces such as by thin bonding wires.

Such electronic packages are disclosed in U.S. Pat. No. 5,055,967 to Sukonnik et al. and in U.S. Pat. No. 5,045,921 to Lin et al., both of which are incorporated by reference in their entireties herein. In the Sukonnik et al. patent, the substrate is an aluminum alloy coated with a dielectric anodic film. In the Lin et al. patent, the substrate is formed from a copper alloy and coated with a layer of a dielectric polymer.

It is frequently desirable to provide one or more electrical interconnections between selected portions of the semiconductor device and the substrate so that portions of these components are at the same voltage potential. To achieve this aim, portions of the dielectric layer are removed from the metallic substrate. Dielectric free regions can be formed by chemically etching the dielectric, or by masking the substrate prior to applying the dielectric. In commonly owned U.S. patent application Ser. No. (Attorney's Docket No. 806-1484), portions of the dielectric layer are removed by ablation with an excimer laser.

While these approaches are all satisfactory, all require a series of complex steps that increase the cost of the electronic package component. There remains, therefore, a need for a low cost method of forming electrically conductive portions in the metallic package component.

The dielectric free regions are small, typically with a depth only slightly more than the thickness of the dielectric layer, on the order of 0.002 inch thick, and a minimal width, on the order 0.010 inch. Mechanical abrasion has been thought to be impossible for providing the dielectric free regions. A mechanical tool having a diameter effective to provide the necessary limited width would be very fragile and subject to frequent fracture. The radius of the tip of the tool would be so large that dielectric free region would be sloped and unsuitable for wire bonding.

SUMMARY OF THE INVENTION

Accordingly, it is an object of the invention to provide a component for an electronic package that has a dielectric free electrical interconnection region that is formed at low cost and to tight tolerances. It is another object of the invention to provide a method to form this region by mechanical milling.

It is a feature of the invention that a precursor annular channel having a width in excess of the desired width is mechanically milled into the package substrate. A cavity is then machined into the substrate to be circumscribed by the outer wall of the precursor annular channel. This cavity has a perimeter larger than the inner wall of the precursor annular channel and effectively reduces the width of the annular channel to the desired width.

As a result, it is a feature of the invention that an electrically conductive annular channel both circumscribes and abuts a centrally disposed cavity in a metallic substrate.

Among the advantages of the invention are that this annular channel is formed at low cost by mechanical milling and has a generally planar base surface suitable for wire bonding.

Accordingly, there is provided a component for an electronic package. This component has a metallic substrate with first and second surfaces that are separated by first sidewalls. The first surface of the metallic substrate has a centrally disposed cavity. This cavity has a base and second sidewalls. The depth of the base is designated $D_1$. An annular channel recessed into the metallic substrate to a depth, $D_2$, both circumscribes and abuts the second sidewalls. A dielectric coating overlies a peripheral portion of the first surface and terminates at the annular channel.

There are also provided two methods for the manufacture of this component. In the first method, there is provided a metallic substrate that has opposing first and second surfaces separated by first sidewalls. A dielectric layer overlies at least this first surface. A precursor annular channel is mechanically milled into the first surface. The precursor annular channel has a depth, $D_2$, and an outer wall that is spaced from the first sidewalls by a length $L_1$. The annular channel further has an inner wall that is spaced from the sidewalls by a length $L_2$. A cavity is then mechanically milled to be circumscribed by the outer wall. This cavity has a depth $D_1$ that is greater than $D_2$. The cavity has second sidewalls that are spaced from the first sidewalls by a length $L_3$ that is greater than $L_2$, but less than $L_1$.

In a second method, there is provided a metallic substrate having opposing first and second surfaces separated by first sidewalls and a dielectric layer overlying at least the first surface. A cavity having a depth, $D_2$ is mechanically milled into a central portion of this first surface. This cavity has second sidewalls that are spaced from the first sidewalls by a length $L_3$. An annular channel is then mechanically milled into the first surface. This channel both circumscribes and abuts the second sidewalls and has a depth $D_1$ that is less than $D_2$.

The above stated objects, features and advantages will become more apparent from the specification and drawings that follow.

IN THE DRAWINGS

DETAILED DESCRIPTION OF THE DRAWINGS

Figure 1:
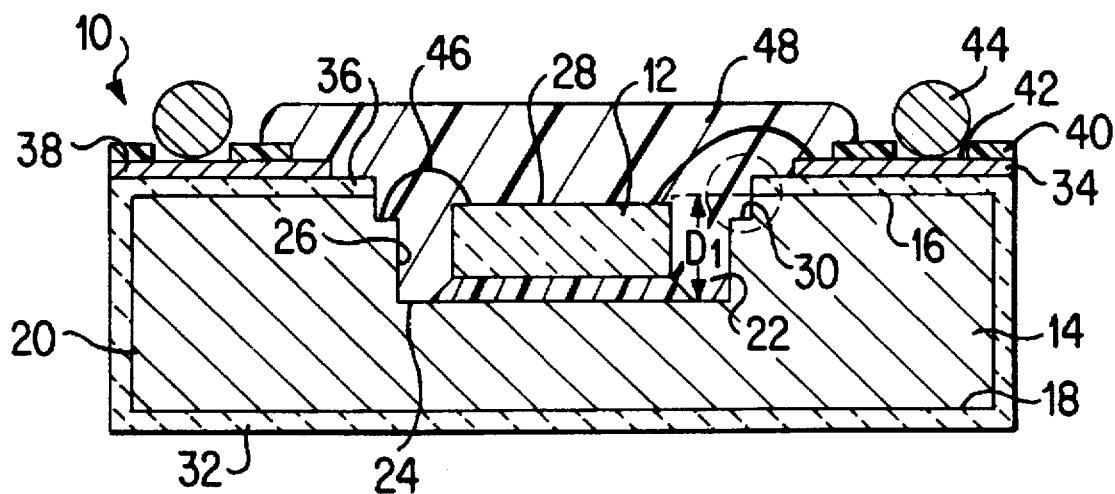
FIG. 1 shows in cross-sectional representation a ball grid array electronic package in accordance with the invention.

FIG. 1 illustrates in cross-sectional representation an electronic package 10 for encasing one or more semiconductor devices 12. One component of the electronic package 10 is a metallic substrate 14. This metallic substrate 14 has opposing first 16 and second 18, generally coplanar, surfaces that are separated by first sidewalls 20.

A cavity 22 is disposed in a central portion of the first surface 16. This cavity has a base 24 and second sidewalls 26. The base 24 is generally coplanar with both the first surface 16 and the second surface 18. The cavity 22 has a depth, $D_1$, effective to provide a top surface 28 of the semiconductor device 22 at approximately the same height as the first surface 16. Typically, $D_1$ is in the range of from about 0.012 inch to about 0.038 inch.

Figure 2:
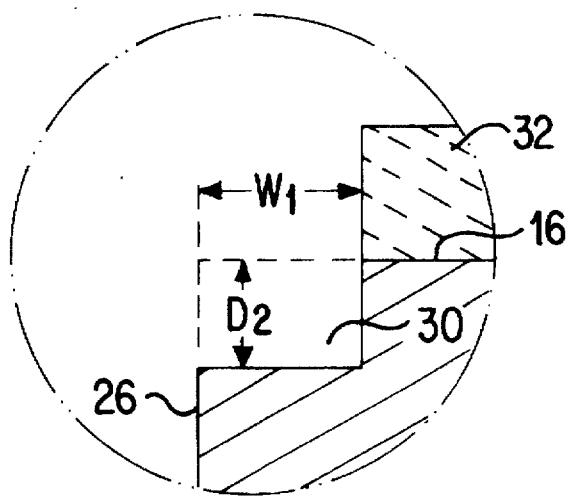
FIG. 2 shows in cross-sectional representation a magnified view of an annular channel in accordance with the invention.

An annular channel 30 both circumscribes and abuts the second sidewalls 26. As best shown in FIG. 2, that is an enhanced view of the portion of the electronic package 10 identified by the broken circle of FIG. 1, the annular channel 30 is recessed by a depth $D_2$ below the first surface 16. The depth of $D_2$ is less than the depth of $D_1$.

A dielectric coating 32 coats a peripheral portion of the first surface 16 and terminates adjacent to the annular channel 30.

Referring back to FIG. 1, the dielectric coating 32 typically coats the first sidewalls 20, a peripheral portion of the first surface 16 and a substantial, if not all, of the second surface 18. Typically, the metallic substrate 14 is selected to be copper, aluminum or an alloy thereof. When the metallic substrate 14 is copper or a copper base alloy, the dielectric coating 32 is typically a polymer such as an epoxy. When the metallic substrate 14 is aluminum or an aluminum base alloy, typically the dielectric coating is an aluminum oxide such as an anodic film.

When an epoxy, the thickness of the dielectric coating is on the order of 0.0005 inch. When an anodic film, the thickness of the dielectric coating 32 is on the order of 0.001 inch.

The electronic package 10 further includes conductive circuit traces 34. These circuit traces have a first end 36 that terminates adjacent to the annular channel 30. The circuit traces 34 have an opposing second end 38 that terminates adjacent to the perimeter of the electronic package 10. The circuit traces 34 may be formed from any electrically conductive material such as a laminated copper foil, a vacuum deposited copper or other metal or a metallized paste bonded to the dielectric coating 32.

A second dielectric coating 40 coats selected portions of the circuit traces 34, leaving the first ends 36 and a portion 42 of the second ends 38 exposed. A first electrical interconnect 44 contacts the circuit trace 34 through the exposed portion 42. This first electrical interconnect 44 may be any conductive bonding medium such as an electrically conductive epoxy or a low melting temperature solder. The first electrical interconnect may take the form of balls, columns or any desirable shape.

A plurality of second electrical interconnects 46 such as thin diameter, on the order of 0.001 inch, gold, aluminum or copper wires, or thin copper foil as utilized in tape automated bonding electrically interconnects input/output pads on the first surface 28 of the semiconductor device 12 to the first ends 36 of circuit traces 34. At least one of the second electrical interconnects 46 electrically interconnects the input/output pads to the annular channel 30. To facilitate wire bonding to the annular channel 30, the surface of the annular channel that is approximately coplanar with the first surface 16 and with the base 24 is as smooth as possible. $D_2$ is at most 0.007 inch. Preferably, $D_2$ is from about 0.002 inch to about 0.005 inch.

A cover 48 then encapsulates a semiconductor device 12 and first ends 36 of circuit traces 34. The cover may be a polymeric encapsulant or a discrete metal, polymer or ceramic component bonded to the second dielectric 40.

As illustrated in FIG. 2, the width $W_1$ of the annular channel 30 is at most 0.015 inch and preferably from about 0.007 inch to about 0.010 inch.

Figure 3:
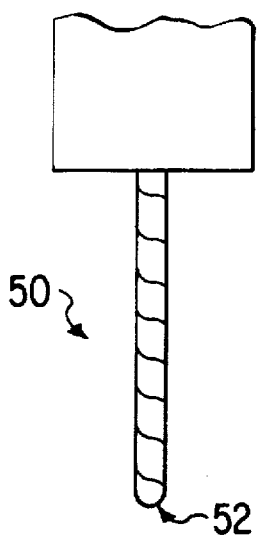
FIG. 3 shows a milling tool as utilized by the prior art.

FIG. 3 illustrates a tool 50 as known from the prior art capable of machining an annular channel 30 of the desired width. This tool may constitute a drill bit or end mill bit and has a nominal diameter of 0.010 inch. The long length of he tool relative to the diameter makes the tool 50 very fragile and prone to breakage. In addition, the tip radius 52 imparts a radius into a substantial portion of the annular channel 30 making wire bonding difficult or impossible.

Figure 4:
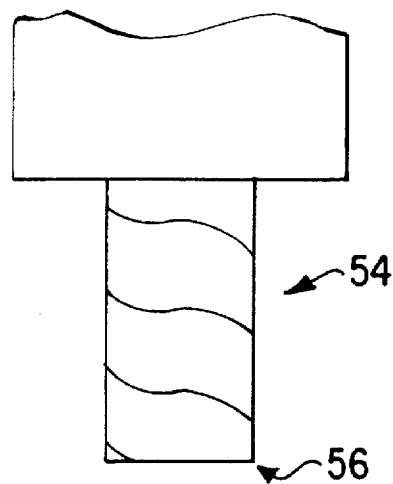
FIG. 4 shows a milling tool as utilized in accordance with the method of the invention.

A superior approach that results in a smooth surface for wire bonding is to use the tool 54 illustrated in FIG. 4. The tool 54 has a diameter from about 6 times to about 15 times greater than the desired diameter, $W_1$, of the annular channel. Preferably, the tool 54 has a diameter from about 8 times to about 12 times greater than the desired width of the annular channel. Because the diameter is large relative to the length of the tool 54, the tool 54 is robust and not subject to breakage. In addition, the large diameter facilitates a very sharp radius 56 at the tip of the tool 54.

Figure 5:
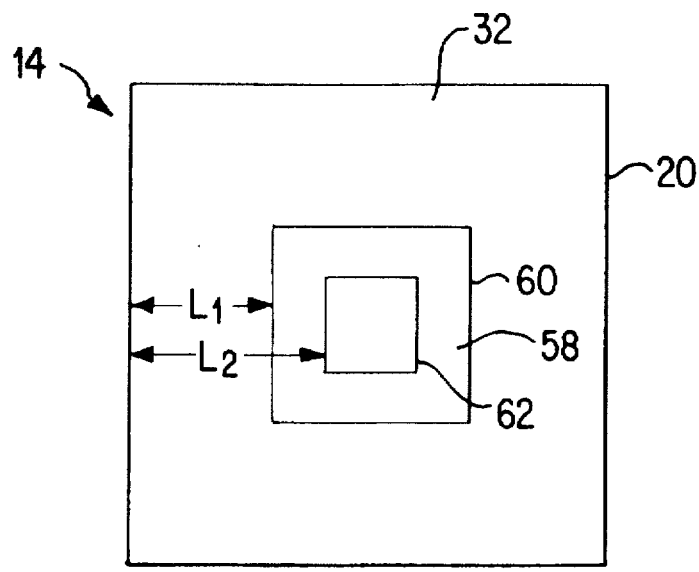
FIG. 5 shows in top planar view an annular channel formed in accordance with a method of the invention.

In accordance with a method of the invention, the metallic substrate 14 illustrated in FIG. 5 has a first surface coated with first dielectric coating 32. A precursor annular channel 58 is mechanically milled into the first surface of the metallic substrate 14 to a depth, $D_2$, that at a minimum, exceeds the thickness of the first dielectric coating 32 to expose the underlying metallic material. As disclosed above, in preferred embodiments, the depth $D_2$ is from about 0.002 inch to about 0.005 inch. An outer wall 60 of the precursor annular channel 58 is spaced from the first sidewalls 20 by a length $L_1$. An inner wall 62 of the precursor annular channel 58 is spaced from the first sidewall 20 by a distance $L_2$.

Figure 6:
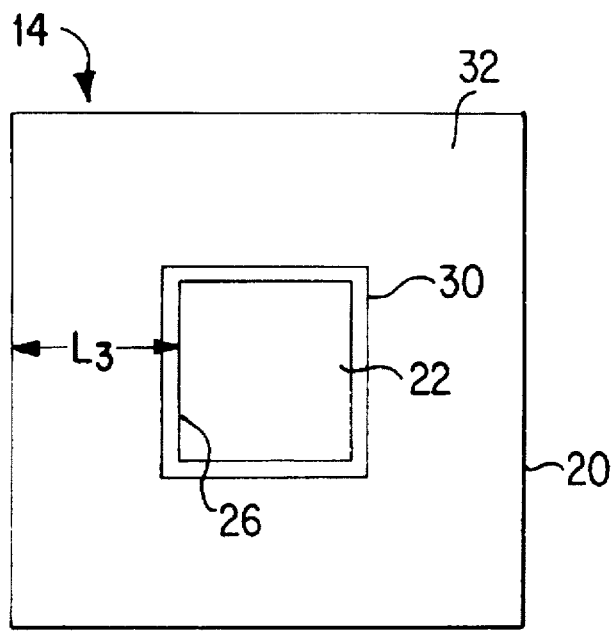
FIG. 6 shows in top planar view a cavity formed in abutting relationship with the annular channel formed in accordance with a method of the invention.

With reference to FIG. 6, a cavity 22 having a depth $D_1$ that is greater than the depth $D_2$ of the precursor annular channel is then formed in a central portion of the first surface of the metallic substrate 14. The cavity may be formed by any desired process such as mechanical milling or coining. The second sidewalls 26 are spaced from the first sidewalls 20 by a length $L_3$ that is greater than the length $L_2$, but less than the length $L_1$. $L_3$ is at most 0.015 inch less than $L_1$ and preferably from about 0.008 inch to about 0.012 inch less than $L_1$.

As a result, the precursor annular channel is cut back from the inner wall to a point equivalent to the desired width of the annular channel 30. Since both the precursor annular channel 58 and the cavity 20 can be formed using a large diameter, sharp radius tool, the annular channel 30 has the desired narrow width and also a smooth surface satisfactory for wire bonding.

We have determined that when the first dielectric coating 32 is an anodic film having a thickness of less than 0.001 inch, the use of the large diameter milling tool in accordance with the invention, produces chips less than 0.003 inch in both the X and the Y direction. Chips of this size are within the tolerances for any anticipated electronic package design.

Figure 7:
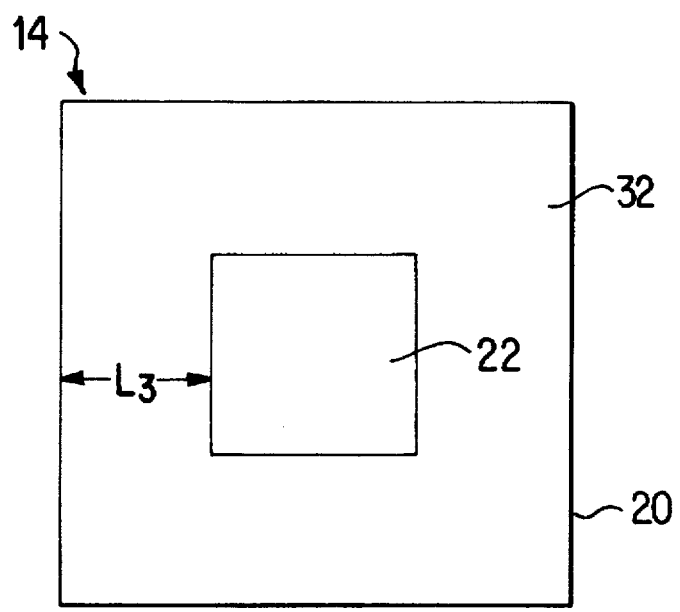
FIG. 7 shows in top planar view a mechanically milled cavity formed in accordance with another method of the invention.

An alternative method of manufacture is illustrated with reference to FIG. 7. The cavity 22 spaced from the first sidewalls 20 by a desired length $L_3$ is initially formed in the metallic substrate 14 by any desired process and extends through the first dielectric coating 32 to the desired cavity depth $D_1$. Subsequent to forming the cavity 20, the annular channel 30, illustrated in FIG. 6, is mechanically milled to abut and circumscribe the second sidewalls 26 of the cavity 20. The large diameter, sharp radius tool is employed, penetrating the first surface to a depth $D_1$ that is less than the depth of the cavity 22. All of the tool, except for that portion necessary to form the annular channel 30 to a desired width, overlies the cavity 20 and does not contact the metallic substrate. The outer edge of the tool is effective to form the smooth surface of the annular channel 30.

It is apparent that there has been provided in accordance with this invention a package for housing one or more semiconductor devices that contains a mechanically milled annular channel that fully satisfies the objects, features and advantages described above. While the invention has been described in connection with specific embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A component for an electronic package, comprising:
   a metallic substrate having first and second surfaces separated by first sidewalls;
   said first surface having a cavity disposed therein, said cavity having a base and second sidewalls, the distance between said base and said first surface being $D_1$;
   an annular channel recessed by a depth, $D_2$ into said first surface, said annular channel circumscribing and abutting said second sidewall; and
   a dielectric coating overlying a peripheral portion of said first surface terminating at said annular channel.

2. The component of claim 1 wherein the depth $D_2$ is less than 0.007 inch.

3. The component of claim 2 wherein the depth $D_2$ is from 0.002 inch to 0.005 inch.

4. The component of claim 2 wherein the width, $W_1$ of said annular channel is less than 0.015 inch.

5. The component of claim 4 wherein the width, $W_1$ of said annular channel is from 0.007 inch to 0.010 inch.

6. The component of claim 4 wherein said metallic substrate is an aluminum alloy and said dielectric coating is an anodic film.

7. An electronic package to encase a semiconductor device, comprising:
   a metallic substrate having first and second surfaces separated by sidewalls, said first surface having a cavity disposed therein, said cavity having a base and second sidewalls, the distance between said base and said first surface being $D_1$;
   an annular channel recessed by a depth, $D_2$ into said first surface, said annular channel both circumscribing and abutting said second sidewall;
   a dielectric coating overlying a peripheral portion of said first surface, said first sidewalls and a substantial portion of said second surface;
   a plurality of electrically conductive circuit traces formed on said first surface overlying said dielectric coating, said circuit traces having a first end terminating adjacent said annular channel and a second end terminating adjacent a perimeter of said substrate;
   a plurality of first electrical interconnects bonded to said second ends;
   a semiconductor device bonded to said base; and
   a plurality of second electrical interconnects electrically interconnecting respective input/output portions of said semiconductor device to both respective first ends of said circuit traces and to said annular channel.

8. The electronic package of claim 7 wherein the depth $D_2$ is less than 0.007 inch.

9. The electronic package of claim 8 wherein the width, $W_1$ of said annular channel is less than 0.015 inch.

10. The electronic package of claim 9 wherein said metallic substrate is an aluminum alloy and said dielectric coating is an anodic film.

11. The electronic package of claim 10 wherein a polymer encapsulant seals said semiconductor device and said second electrical interconnects.

12. The electronic package of claim 10 wherein a discrete cover seals said semiconductor device and said second electrical interconnects.

13. The electronic package of claim 10 wherein said first electrical interconnects comprise a metallic solder.

* * * * *